United States Patent
Li et al.

(10) Patent No.: US 10,153,289 B2
(45) Date of Patent: Dec. 11, 2018

(54) NON-VOLATILE MEMORY AND FABRICATING METHOD THEREOF

(71) Applicant: United Microelectronics Corp., Hsinchu (TW)

(72) Inventors: Ji-Ye Li, Singapore (SG); Duan-Quan Liao, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/053,952

(22) Filed: Feb. 25, 2016

(65) Prior Publication Data

US 2017/0213838 A1 Jul. 27, 2017

(30) Foreign Application Priority Data

Jan. 21, 2016 (TW) .............................. 105101852 A

(51) Int. Cl.
| | |
|---|---|
| *H01L 27/11521* | (2017.01) |
| *H01L 21/28* | (2006.01) |
| *H01L 29/423* | (2006.01) |
| *H01L 29/66* | (2006.01) |
| *H01L 27/11536* | (2017.01) |

(52) U.S. Cl.
CPC .. *H01L 27/11521* (2013.01); *H01L 21/28273* (2013.01); *H01L 27/11536* (2013.01); *H01L 29/42328* (2013.01); *H01L 29/66825* (2013.01)

(58) Field of Classification Search
None
See application file for complete search history.

(56) References Cited

U.S. PATENT DOCUMENTS

| | | | |
|---|---|---|---|
| 8,951,864 B2 | 2/2015 | Wang et al. | |
| 9,023,726 B1* | 5/2015 | Cheng | H01L 21/28273 438/184 |
| 9,583,641 B1* | 2/2017 | Chang | H01L 29/7923 |
| 2009/0061581 A1* | 3/2009 | Tsai | H01L 27/115 438/257 |

(Continued)

OTHER PUBLICATIONS

Yoohyun Noh, et al., "A New Metal Control Gate Last Process (MCGL process) for High Performance DC-SF (Dual Control gate with Surrounding Floating gate) 3D NAND Flash Memory," 2012 Symposium on VLSI Technology (VLSIT), Jun. 12-14, 2012, pp. 19-20.

(Continued)

*Primary Examiner* — Reema Patel
*Assistant Examiner* — Steven Christopher
(74) *Attorney, Agent, or Firm* — J.C. Patents

(57) ABSTRACT

A non-volatile memory including a substrate, a charge storage structure, two metal gate structures, a first dielectric layer, a second dielectric layer, a first doped region and a second doped region is provided. The charge storage structure is disposed on the substrate. The metal gate structures are disposed on the substrate at two sides of the charge storage structure. The first dielectric layer is disposed between the charge storage structure and the metal gate structures. The second dielectric layer is disposed between the charge storage structure and the substrate. The first doped region and the second doped region are disposed in the substrate at sides of the metal gate structures away from the charge storage structure.

7 Claims, 5 Drawing Sheets

(56) References Cited

U.S. PATENT DOCUMENTS

| | | |
|---|---|---|
| 2013/0082318 A1 | 4/2013 | Liu et al. |
| 2014/0264540 A1* | 9/2014 | Tan .................... H01L 45/1226 |
| | | 257/320 |
| 2015/0137207 A1 | 5/2015 | Chuang et al. |
| 2016/0218112 A1* | 7/2016 | Sekine .............. H01L 29/42344 |

OTHER PUBLICATIONS

Sungjin Whang, et al., "Novel 3-Dimensional Dual Control-Gate with Surrounding Floating-Gate (DC-SF) NAND Flash Cell for 1Tb File Storage Application," 2010 IEEE International Electron Devices Meeting (IEDM), Dec. 6-8, 2010, pp. 29.7.1-29.7.4.

* cited by examiner

NON-VOLATILE MEMORY AND FABRICATING METHOD THEREOF

CROSS-REFERENCE TO RELATED APPLICATION

This application claims the priority benefit of Taiwan application serial no. 105101852, filed on Jan. 21, 2016. The entirety of the above-mentioned patent application is hereby incorporated by reference herein and made a part of this specification.

BACKGROUND OF THE INVENTION

Field of the Invention

The invention relates to a memory and a fabricating method thereof, and particularly relates to a non-volatile memory and a fabricating method thereof.

Description of Related Art

With the evolution of transistor technology, the problem of gate leakage current can be avoided by using a high-k material. Also, processing speed may be faster by using a metal gate. Therefore, a non-volatile memory structure using a high-k/metal gate transistor has been developed.

Take a flash memory as an example. Currently, when a control gate of the flash memory is fabricated using metal gate structures, since the metal gate structures in a flash memory region and a logic device region (e.g., a core device region) are fabricated at the same time, resulting in the problem that a height of the metal gate structure in the flash memory region is insufficient. Thereby, the operating performance of the flash memory is decreased, and even the flash memory may not be normally operated.

Specifically, since the metal gate structures in the flash memory region and the logic device region are fabricated at the same time, and a floating gate and a dummy gate in the flash memory region are stacked disposed in the manufacturing process of the metal gate structure, a height of the dummy gate of the flash memory region is more than a height of the dummy gate of the logic device region. Therefore, when a hard mask layer on the dummy gate of the logic device region is removed by a chemical mechanical polishing method, a portion of the dummy gate in the flash memory region is removed at the same time, resulting in the problem that the height of the metal gate structure formed subsequently in the flash memory region is insufficient.

SUMMARY OF THE INVENTION

The invention provides a non-volatile memory, and a metal gate structure thereof may have a sufficient height, such that the non-volatile memory may have the better operating performance.

The invention provides a fabricating method of a non-volatile memory, and the non-volatile memory fabricated thereby may have a metal gate structure with a sufficient height.

The invention provides a non-volatile memory including a substrate, a charge storage structure, two metal gate structures, a first dielectric layer, a second dielectric layer, a first doped region and a second doped region. The charge storage structure is disposed on the substrate. The metal gate structures are disposed on the substrate at two sides of the charge storage structure. The first dielectric layer is disposed between the charge storage structure and the metal gate structures. The second dielectric layer is disposed between the charge storage structure and the substrate. The first doped region and the second doped region are disposed in the substrate at sides of the metal gate structures away from the charge storage structure.

According to an embodiment of the invention, in the non-volatile memory, a well region is further included. The well region is disposed in the substrate. The first doped region and the second doped region are located in the well region.

According to an embodiment of the invention, in the non-volatile memory, a third doped region is further included. The third doped region is disposed in the substrate below the charge storage structure.

According to an embodiment of the invention, in the non-volatile memory, each of the metal gate structures includes a gate dielectric layer, a high-k dielectric layer, a work function metal layer, and a metal gate layer disposed on the substrate in sequence.

According to an embodiment of the invention, in the non-volatile memory, a top surface of the charge storage structure is lower than top surfaces of the metal gate structures, for example.

According to an embodiment of the invention, in the non-volatile memory, the charge storage structure may be a floating gate.

According to an embodiment of the invention, in the non-volatile memory, a cap layer is further included. The cap layer is disposed on the charge storage structure.

According to an embodiment of the invention, in the non-volatile memory, a spacer is further included. The spacer is disposed on sidewalls of the metal gate structures away from the charge storage structure.

The invention also provides a fabricating method of a non-volatile memory including the following steps. A charge storage structure is formed on a substrate. A metal gate structure is formed on the substrate at two sides of the charge storage structure respectively. A first dielectric layer is formed between the charge storage structure and the metal gate structures. A second dielectric layer is formed between the charge storage structure and the substrate. A first doped region and a second doped region are formed in the substrate at sides of the metal gate structures away from the charge storage structure.

According to an embodiment of the invention, in the fabricating method of the non-volatile memory, forming a well region in the substrate is further included. The first doped region and the second doped region are formed in the well region.

According to an embodiment of the invention, in the fabricating method of the non-volatile memory, a method of forming the charge storage structure may include the following steps. A gate dielectric material layer, a dummy gate material layer, and a hard mask material layer are formed on the substrate in sequence. An opening exposing the substrate is formed in the hard mask material layer, the dummy gate material layer, and the gate dielectric material layer. A charge storage material layer filled in the opening is formed. A portion of the charge storage material layer in the opening is removed to form the charge storage structure.

According to an embodiment of the invention, in the fabricating method of the non-volatile memory, a method of removing the portion of the charge storage material layer is an etching-back method or a combination of a chemical mechanical polishing method and the etching-back method, for example.

According to an embodiment of the invention, in the fabricating method of the non-volatile memory, forming the first dielectric layer on sidewalls of the opening before forming the charge storage structure is further included.

According to an embodiment of the invention, in the fabricating method of the non-volatile memory, forming a third doped region in the substrate below the opening before forming the charge storage structure is further included.

According to an embodiment of the invention, in the fabricating method of the non-volatile memory, forming the second dielectric layer on the substrate exposed by the opening before forming the charge storage structure is further included.

According to an embodiment of the invention, in the fabricating method of the non-volatile memory, forming a cap layer filled in the opening after forming the charge storage structure is further included.

According to an embodiment of the invention, in the fabricating method of the non-volatile memory, a method of forming the metal gate structures may include the following steps. A patterning process is performed on the hard mask material layer, the dummy gate material layer, and the gate dielectric material layer, so as to form two dummy gate structures. The dummy gate structures are located at two sides of the charge storage structure, and each of the dummy gate structures includes a gate dielectric layer, a dummy gate, and a hard mask layer stacked on the substrate in sequence. A third dielectric layer covering the dummy gate structures is formed. A portion of the third dielectric layer and the hard mask layers are removed to expose the dummy gates. The dummy gates are removed to form two gate openings. A high-k dielectric layer, a work function metal layer, and a metal gate layer are formed in each of the gate openings in sequence respectively.

According to an embodiment of the invention, in the fabricating method of the non-volatile memory, a top surface of the charge storage structure is lower than top surfaces of the metal gate structures, for example.

According to an embodiment of the invention, in the fabricating method of the non-volatile memory, the charge storage structure may be a floating gate.

According to an embodiment of the invention, in the fabricating method of the non-volatile memory, forming a spacer on sidewalls of the metal gate structures away from the charge storage structure is further included.

Based on the above description, in the non-volatile memory and the fabricating method thereof provided in the invention, since the two metal gate structures are disposed at two sides of the charge storage structure rather than stacked arrangement, the metal gate structures may have the sufficient heights, such that the non-volatile memory has the better operating performance.

In order to make the aforementioned features and advantages of the disclosure more comprehensible, embodiments accompanied with FIGURES are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross-sectional views illustrating a manufacturing process of a non-volatile memory according to an embodiment of the invention.

Figure 1A:
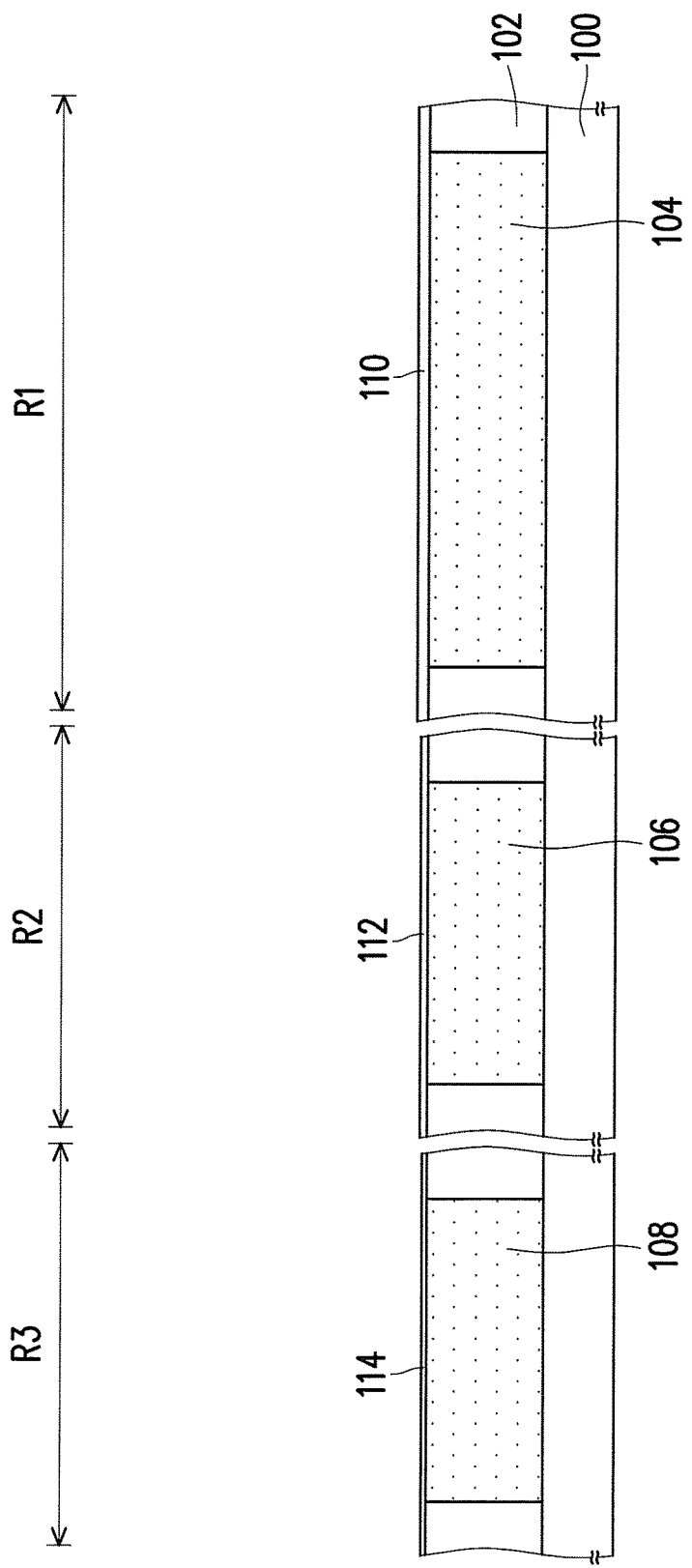
FIG. 1A to FIG. 1E are cross-sectional views illustrating a manufacturing process of a non-volatile memory according to an embodiment of the invention.

Referring to FIG. 1A, a substrate 100 is provided. The substrate 100 is a semiconductor substrate, for example (e.g., a silicon substrate). A plurality of isolation structures 102 have been formed in the substrate 100. The isolation structures 102 are shallow trench isolation (STI) structures, for example. The substrate 100 includes a memory device region R1, and the substrate 100 may further include an I/O device region R2 and a core device region R3.

A well region 104 may be selectively formed in the substrate 100 in the memory device region R1. Additionally, well regions 106 and 108 may be further selectively formed in the substrate 100 in the I/O device region R2 and the core device region R3 respectively. A method of forming the well regions 104, 106 and 108 is an ion implantation method, for example. Additionally, the well regions 104, 106 and 108 may be formed separately or formed at the same time. A person having ordinary skill in the art may select the way of forming the well regions 104, 106 and 108 according to the product design requirements or the manufacturing process requirements.

A gate dielectric material layer 110 is formed on the substrate 100 in the memory device region R1. Additionally, gate dielectric material layers 112 and 114 may be formed on the substrate 100 in the I/O device region R2 and the core device region R3 respectively. Thicknesses of the gate dielectric material layers 110, 112 and 114 may be adjusted according to the device operating voltage in each of the regions respectively. In the present embodiment, the thickness of the gate dielectric material layer 110 is more than the thickness of the gate dielectric material layer 112, for example, and the thickness of the gate dielectric material layer 112 is more than the thickness of the gate dielectric material layer 114, for example. However, the invention is not limited thereto. Additionally, the gate dielectric material layers 110, 112 and 114 may be formed separately or formed at the same time. A person having ordinary skill in the art may select the way of forming the gate dielectric material layers 110, 112 and 114 according to the product design requirements or the manufacturing process requirements. A method of forming the gate dielectric material layers 110, 112 and 114 is a thermal oxidation method or a chemical vapor deposition method, for example.

Figure 1B:
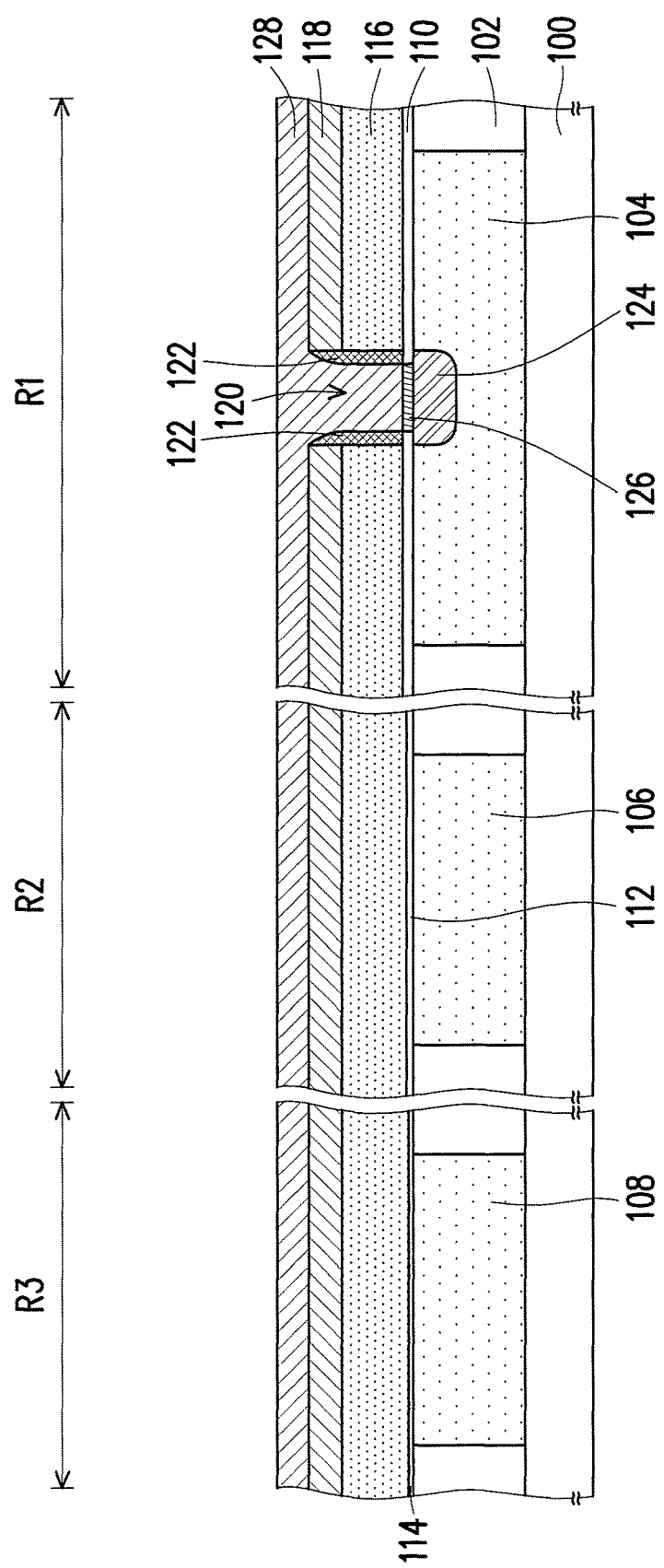

Referring to FIG. 1B, a dummy gate material layer 116 and a hard mask material layer 118 are formed on the gate dielectric material layers 110, 112 and 114 in sequence. A material of the dummy gate material layer 116 is polycrystalline silicon, for example. A method of forming the dummy gate material layer 116 is a chemical vapor deposition method, for example. The hard mask material layer 118 may be a single-layer structure or a multi-layer structure. A material of the hard mask material layer 118 is silicon nitride, silicon oxide, or a combination thereof, for example. A method of forming the hard mask material layer 118 is a chemical vapor deposition method, for example.

In the memory device region R1, an opening 120 exposing the gate dielectric material layer 110 is formed in the hard mask material layer 118 and the dummy gate material layer 116. A method of forming the opening 120 is a combination of a lithography process and the etching process, for example.

A dielectric layer 122 is formed on sidewalls of the opening 120. A material of the dielectric layer 122 is silicon oxide, for example. The dielectric layer 122 may be formed using the method similar to the method of forming the spacer. However, the invention is not limited thereto. For example, a method of forming the dielectric layer 122 may be that, a dielectric material layer (not shown) is conformally formed in the opening 120 first, and then an etching-back process is performed on the dielectric material layer. Additionally, in the process of performing the etching-back process on the dielectric material layer, a portion of the gate dielectric material layer 110 may be removed together, such that the opening 120 exposing the substrate 100 is formed in the hard mask material layer 118, the dummy gate material layer 116, and the gate dielectric material layer 110.

A doped region 124 is selectively formed in the substrate 100 below the opening 120. The doped region 124 is conducive to the operation of the non-volatile memory. A method of forming the doped region 124 is an ion implantation method, for example.

A dielectric layer 126 is formed on the substrate 100 exposed by the opening 120. The dielectric layer 126 may be used as a tunneling dielectric layer. A material of the dielectric layer 126 is silicon oxide, for example. A method of forming the dielectric layer 126 is a thermal oxidation method, for example.

A charge storage material layer 128 filled in the opening 120 is formed. A material of the charge storage material layer 128 is doped polycrystalline silicon, for example. A method of forming the charge storage material layer 128 is a chemical vapor deposition method, for example.

Figure 1C:
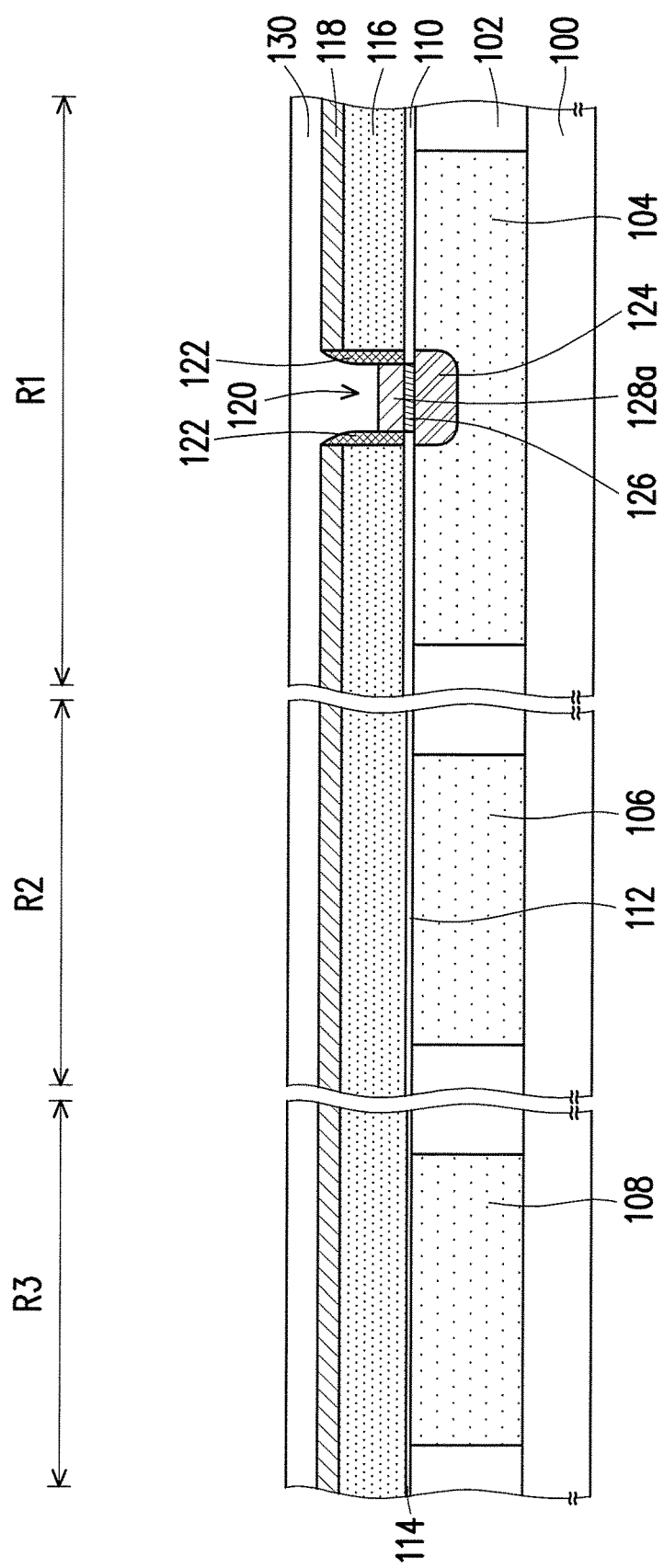

Referring to FIG. 1C, a portion of the charge storage material layer 128 in the opening 120 is removed to form a charge storage structure 128a on the dielectric layer 126. The charge storage structure 128a may be a floating gate. A top surface of the charge storage structure 128a is lower than a top surface of the dummy gate material layer 116, for example. A method of removing the portion of the charge storage material layer 128 is an etching-back method or a combination of a chemical mechanical polishing method and the etching-back method, for example. Additionally, in the process of removing the portion of the charge storage material layer 128, a portion of the hard mask material layer 118 may be removed, such that a thickness of the hard mask material layer 118 is decreased. In the present embodiment, the charge storage structure 128a is formed following the aforementioned method. However, the invention is not limited thereto.

A cap layer 130 filled in the opening 120 may be formed. The cap layer 130 may be used to protect the charge storage structure 128a thereunder. Additionally, the cap layer 130 may be extended on the hard mask material layer 118. A material of the cap layer 130 is silicon oxide, for example. A method of forming the cap layer 130 is a chemical vapor deposition method, for example.

Figure 1D:
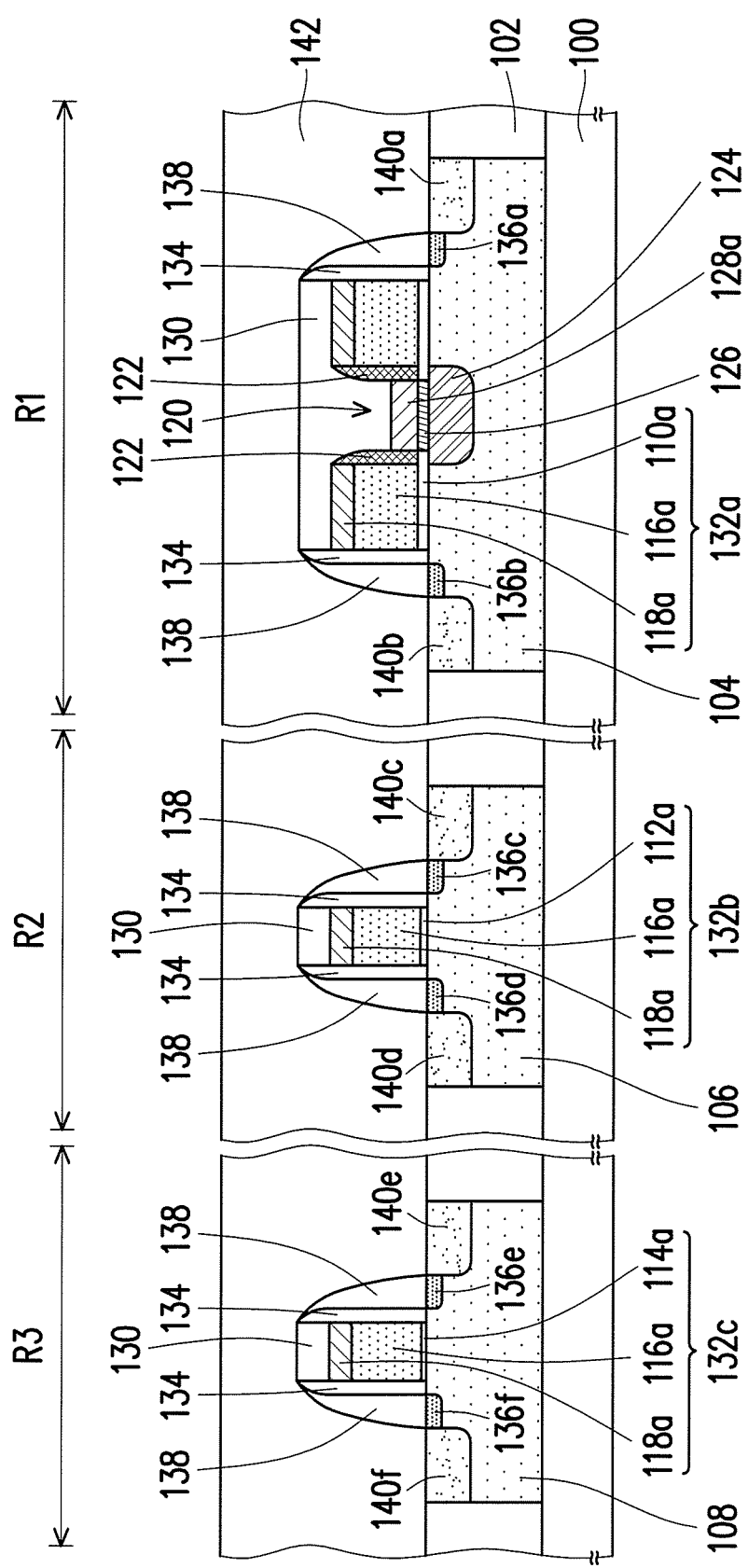

Referring to FIG. 1D, a patterning process is performed on the cap layer 130, the hard mask material layer 118, the dummy gate material layer 116, and the gate dielectric material layer 110, so as to form two dummy gate structures 132a in the memory device region R1. The dummy gate structures 132a are located at two sides of the charge storage structure 128a, and each of the dummy gate structures 132a includes a gate dielectric layer 110a, a dummy gate 116a, and a hard mask layer 118a stacked on the substrate 100 in sequence.

Additionally, in the process of forming the dummy gate structures 132a, the patterning process may be further performed on the cap layer 130, the hard mask material layer 118, the dummy gate material layer 116, and the gate dielectric material layers 112 and 114 in the I/O device region R2 and the core device region R3 at the same time. Therefore, dummy gate structures 132b and 132c are formed in the I/O device region R2 and the core device region R3 respectively. The dummy gate structure 132b includes a gate dielectric layer 112a, the dummy gate 116a, and the hard mask layer 118a stacked on the substrate 100 in sequence. The dummy gate structure 132c includes a gate dielectric layer 114a, the dummy gate 116a, and the hard mask layer 118a stacked on the substrate 100 in sequence.

A spacer 134 may be formed on sidewalls of the dummy gate structures 132a away from the charge storage structure 128a. A material of the spacer 134 is silicon nitride, for example. A method of forming the spacer 134 is that, a spacer material layer covering the dummy gate structures 132a is formed first, and then an etching-back process is performed on the spacer material layer, for example. Additionally, the spacer 134 may be further formed on sidewalls of the dummy gate structures 132b and 132c.

Light doped regions 136a-136f may be selectively formed in the well regions 104, 106 and 108 of the substrate 100 respectively. The light doped regions 136a and 136b are located at sides of the dummy gate structures 132a away from the charge storage structure 128a. The light doped regions 136c and 136d are located in the well region 106 at two sides of the dummy gate structure 132b. The light doped regions 136e and 136f are located in the well region 108 at two sides of the dummy gate structure 132c. The light doped regions 136a-136f may be used as a source/drain extension region respectively. A method of forming the light doped regions 136a-136f is an ion implantation method, for example. Additionally, a person having ordinary skill in the art may adjust the doping condition (e.g., dopant species and dopant concentration) of the light doped regions 136a-136f according to the product design requirements.

A spacer 138 may be formed on the sidewall of the spacer 134 respectively. A material of the spacer 138 is silicon nitride, for example. A method of forming the spacer 138 is that, a spacer material layer covering the spacer 134 and the dummy gate structures 132a-132c is formed first, and then an etching-back process is performed on the spacer material layer, for example.

Doped regions 140a and 140b are formed in the substrate 100 at sides of the dummy gate structures 132a away from the charge storage structure 128a. The doped regions 140a and 140b may be located in the well region 104. Additionally, doped regions 140c-140f may be further formed in the substrate 100, wherein the doped regions 140c and 140d are located in the well region 106 at two sides of the dummy gate structure 132b, and the doped regions 140e and 140f are located in the well region 108 at two sides of the dummy gate structure 132c. The doped regions 140a-140c are farther from the dummy gate structures 132a-132c compared to the light doped regions 136a-136f. The doped regions 140a-140f may be used as a source region or a drain region respectively. A method of forming the doped regions 140a-140f is an ion implantation method, for example. Additionally, a person having ordinary skill in the art may adjust the doping condition (e.g., dopant species and dopant concentration) of the doped regions 140a-140f according to the product design requirements.

A dielectric layer 142 covering the dummy gate structures 132a-132c may be formed. A material of the dielectric layer 142 is silicon oxide, for example. A method of forming the dielectric layer 142 is a chemical vapor deposition method, for example.

Figure 1E:
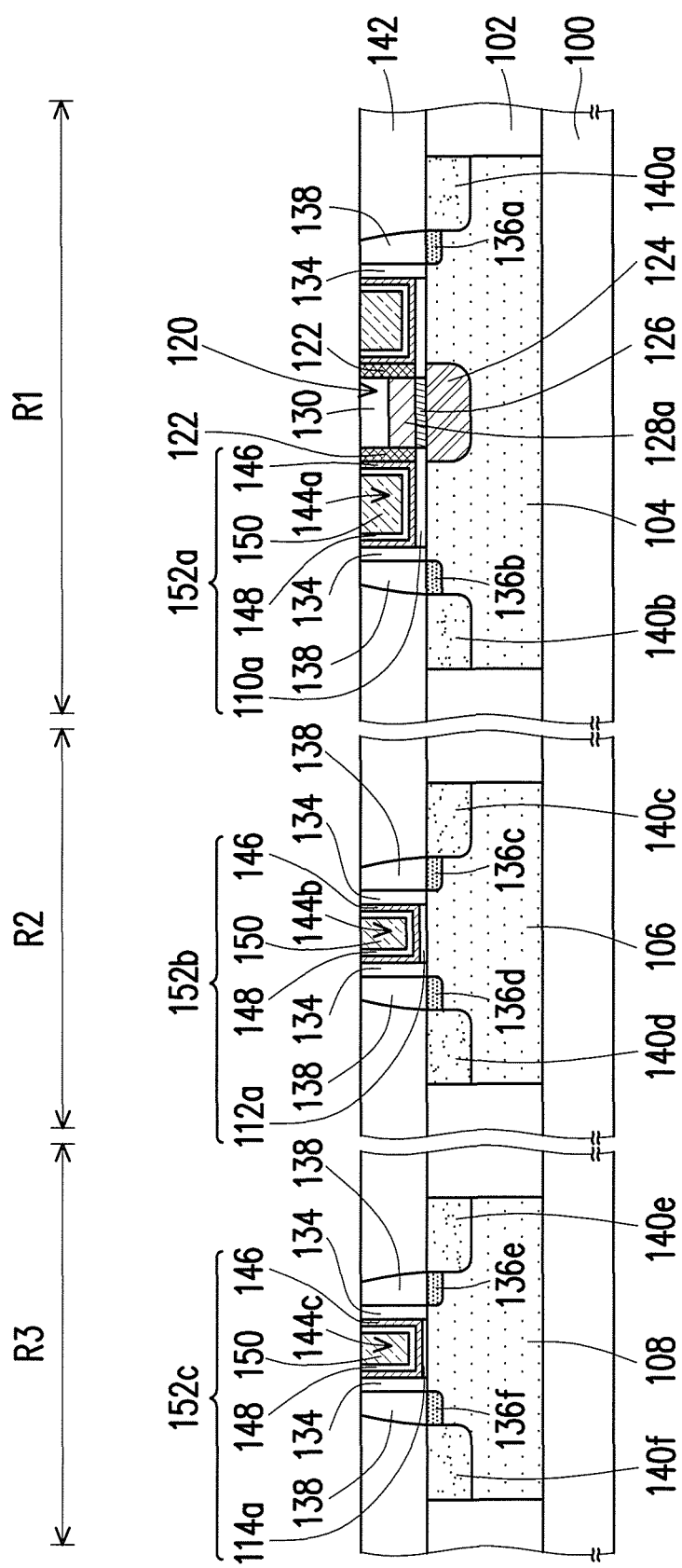

Referring to FIG. 1E, a portion of the dielectric layer 142, the cap layer 130, and the hard mask layer 118a are removed to expose the dummy gate 116a. A method of removing the portion of the dielectric layer 142, the cap layer 130, and the hard mask layer 118a is a chemical mechanical polishing method, for example. In this step, a portion of the dummy gate 116a, and a portion of the spacer 134 and a portion of the spacer 138 located at two sides of the dummy gate 116a may be removed, such that heights of the dummy gate 116a, the spacer 134, and the spacer 138 are decreased.

The dummy gates 116a are removed, such that two gate openings 144a are formed in the memory device region R1, and gate openings 144b and 144c are formed in the I/O device region R2 and the core device region R3 respectively. A method of removing the dummy gates 116a is a dry etching method or a wet etching method, for example.

A high-k dielectric layer 146, a work function metal layer 148, and a metal gate layer 150 are formed in the gate openings 144a-144c in sequence respectively. Thereby, metal gate structures 152a may be formed on the substrate 100 at two sides of the charge storage structure 128a respectively in the memory device region R1, and metal gate structures 152b and 152c may be formed in the I/O device region R2 and the core device region R3 respectively. Additionally, the dielectric layer 122 is located between the charge storage structure 128a and the metal gate structures 152a to isolate the charge storage structure 128a and the metal gate structures 152a. A top surface of the charge storage structure 128a is lower than top surfaces of the metal gate structures 152a, for example.

The metal gate structures 152a include the gate dielectric layer 110a, the high-k dielectric layer 146, the work function metal layer 148, and the metal gate layer 150 disposed on the substrate 100 in sequence. The metal gate structure 152b includes the gate dielectric layer 112a, the high-k dielectric layer 146, the work function metal layer 148, and the metal gate layer 150 disposed on the substrate 100 in sequence. The metal gate structure 152c includes the gate dielectric layer 114a, the high-k dielectric layer 146, the work function metal layer 148, and the metal gate layer 150 disposed on the substrate 100 in sequence. A material of the high-k dielectric layer 146 is $Al_2O_3$, $Y_2O_3$, $ZrSi_xO_y$, $HfSi_xO_y$, $La_2O_3$, $ZrO_2$, $HfO_2$, $Ta_2O_5$, $Pr_2O_3$, or $TiO_2$, for example. A material of the work function metal layer 148 is TiN, TaC, TaCNO, TaCN, TiAl, or TaN, for example. A material of the metal gate layer 150 is W or Al, for example.

For example, the high-k dielectric layer 146, the work function metal layer 148, and the metal gate layer 150 may be formed by the following method. However, the invention is not limited thereto. A high-k dielectric material layer (not shown), a work function metal material layer (not shown), and a metal gate material layer (not shown) are formed in the gate openings 144a-144c in sequence by a deposition process, and then the high-k dielectric material layer, the work function metal material layer, and the metal gate material layer outside the gate openings 144a-144c are removed.

In the present embodiment, the metal gate structures 152a-152c are formed following the aforementioned method. However, the invention is not limited thereto. For example, the metal gate structures 152a-152c of the aforementioned embodiment are formed by the manufacturing process of the metal gate structure using the high-k last process, so as to form the "U-shaped" high-k dielectric layer 146. However, in another embodiment, the metal gate structures 152a-152c may be formed by the manufacturing process of the metal gate structure using the high-k first process. That is, the high-k dielectric layer may be formed before forming the dummy gate, thereby forming the "line-shaped" high-k dielectric layer. Additionally, the manufacturing process of the metal gate structure using the high-k first process is the technique known by a person having ordinary skill in the art. Therefore, the description thereof is omitted herein.

It can be known based on the aforementioned embodiments, in the aforementioned non-volatile memory, the two metal gate structures 152a in the memory device region R1 are disposed at two sides of the charge storage structure 128a rather than stacked arrangement, and thereby forming a horizontal-type non-volatile memory. In this way, when the hard mask layer 118a on the dummy gates 116a is removed, since the heights of the dummy gates 116a in the memory device region R1, the I/O device region R2, and the core device region R3 are not significantly different, the problem of over-removing the dummy gates 116a in the memory device region R1 does not occur even when the metal gate structures 152a-152c in the memory device region R1, the I/O device region R2, and the core device region R3 are manufactured at the same time. Therefore, the problem that the height of the metal gate structures 152a formed subsequently is insufficient may be avoided. Additionally, since the metal gate structures 152a in the non-volatile memory may have the sufficient height, the non-volatile memory may have the better operating performance.

Hereinafter, the non-volatile memory of the present embodiment is illustrated by FIG. 1E. Additionally, although the fabricating method of the non-volatile memory of the present embodiment is illustrated by the aforementioned fabricating method as an example, the fabricating method of the non-volatile memory of the invention is not limited thereto.

Referring to FIG. 1E, the non-volatile memory includes the substrate 100, the charge storage structure 128a, two metal gate structures 152a, the dielectric layer 122, the dielectric layer 126, the doped region 140a, and the doped region 140b. The charge storage structure 128a is disposed on the substrate 100. The charge storage structure 128a may be a floating gate. The top surface of the charge storage structure 128a is lower than the top surfaces of the metal gate structures 152a, for example. The metal gate structures 152a are disposed on the substrate 100 at two sides of the charge storage structure 128a. Each of the metal gate structures 152a includes the gate dielectric layer 110a, the high-k dielectric layer 146, the work function metal layer 148, and the metal gate layer 150 disposed on the substrate 100 in sequence. The dielectric layer 122 is disposed between the charge storage structure 128a and the metal gate structures 152a. The dielectric layer 126 is disposed between the charge storage structure 128a and the substrate 100. The doped region 140a and the doped region 140b are disposed in the substrate 100 at sides of the metal gate structures 152a away from the charge storage structure 128a.

Additionally, the non-volatile memory may further include at least one of the well region 104, the doped region 124, the cap layer 130, the spacer 134, the light doped region 136a, the light doped region 136b, and the spacer 138 selectively. The well region 104 is disposed in the substrate 100. The doped region 140a and the doped region 140b are located in the well region 104. The doped region 124 is disposed in the substrate 100 below the charge storage structure 128a. The cap layer 130 is disposed on the charge storage structure 128a. The spacer 134 is disposed on sidewalls of the metal gate structures 152a away from the charge storage structure 128a. The light doped region 136a is disposed in the substrate 100 between the doped region 140a and the metal gate structure 152a. The light doped region 136b is disposed in the substrate 100 between the doped region 140b and the metal gate structure 152a. The spacer 138 is disposed on the sidewall of the spacer 134.

Additionally, the material, the arrangement manner, the forming method, and the efficacy of each of the components in the non-volatile memory have been illustrated in detail in the aforementioned fabricating method of FIG. 1A to FIG. 1E, and thus it will not be repeated herein.

In summary, in the non-volatile memory and the fabricating method thereof in the aforementioned embodiments, since the two metal gate structures are disposed at two sides of the charge storage structure rather than stacked arrangement, the metal gate structures may have the sufficient heights, such that the non-volatile memory has the better operating performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A non-volatile memory, comprising:
   a substrate;
   a charge storage structure disposed on the substrate;
   two metal gate structures, wherein one of the metal gate structures is disposed on the substrate at one of two sides of the charge storage structure, and the other of the metal gate structures is disposed on the substrate at the other of the two sides of the charge storage structure;
   a first dielectric layer disposed between the charge storage structure and the metal gate structures;
   a second dielectric layer disposed between the charge storage structure and the substrate; and
   a first doped region disposed in the substrate at a side of one of the metal gate structures away from the charge storage structure; and
   a second doped region disposed in the substrate at a side of the other of the metal gate structures away from the charge storage structure,
   wherein an entire surface of the charge storage structure which faces directly away from the substrate is lower than surfaces of the metal gate structures which face directly away from the substrate.

2. The non-volatile memory according to claim 1, further comprising a well region disposed in the substrate, wherein the first doped region and the second doped region are located in the well region.

3. The non-volatile memory according to claim 1, further comprising a third doped region disposed in the substrate below the charge storage structure.

4. The non-volatile memory according to claim 1, wherein each of the metal gate structures comprises:
   a gate dielectric layer, a high-k dielectric layer, a work function metal layer, and a metal gate layer disposed on the substrate in sequence.

5. The non-volatile memory according to claim 1, wherein the charge storage structure comprises a floating gate.

6. The non-volatile memory according to claim 1, further comprising a cap layer disposed on the charge storage structure.

7. The non-volatile memory according to claim 1, further comprising a spacer disposed on sidewalls of the metal gate structures away from the charge storage structure.

* * * * *